United States Patent [19]
Afek et al.

[11] Patent Number: 5,729,153
[45] Date of Patent: Mar. 17, 1998

[54] OUTPUT BUFFER WITH OSCILLATION DAMPING

[75] Inventors: Yachin Afek, Kfar-Saba; Vladimir Koifman, Rishon-Lezion; Natan Baron, St. Oranit; Eytan Engel, Rosh-Haain, all of Israel

[73] Assignee: Motorola, Inc., Schamburg, Ill.

[21] Appl. No.: 559,864

[22] Filed: Nov. 20, 1995

[51] Int. Cl.$^6$ ............................. H03K 19/0948
[52] U.S. Cl. ....................... 326/27; 326/33; 326/86
[58] Field of Search ................. 326/33–34, 26–27, 326/83, 86, 112, 119, 121

[56] References Cited

U.S. PATENT DOCUMENTS

| | | | |
|---|---|---|---|
| 4,862,018 | 8/1989 | Taylor et al. | 326/27 |
| 5,008,568 | 4/1991 | Leung et al. | 326/27 |
| 5,028,817 | 7/1991 | Patil | 326/27 |
| 5,121,000 | 6/1992 | Naghsineh | 326/33 |
| 5,473,263 | 12/1995 | Mahmood | 326/27 |

Primary Examiner—Jon Santamauro
Attorney, Agent, or Firm—Robert M. Handy; Harry A. Wolin

[57] ABSTRACT

Oscillation of the output (16, 17) of an integrated circuit output buffer (43) is automatically damped by sensing ground lead (18) transients as the buffer output (16, 17) changes, and when the ground lead (18) swing is large enough, using the sensed change to apply a turn-off signal of the appropriate polarity to a transistor (N1) serially placed in the output buffer (43) to add resistance during the transition. The added resistance damps out the oscillations quickly to prevent rebound of the buffer output voltage past the logic transition threshold (Vol). An RC time constant (R1, C1) controls the duration of the added resistance which disappears after the transition is complete. The action of a damping control circuit (45) is speed dependent so that greater damping is provided for fast transitions when oscillations would be more sever and no damping during slow transitions when damping is not needed.

17 Claims, 4 Drawing Sheets

OUTPUT BUFFER WITH OSCILLATION DAMPING

BACKGROUND OF THE INVENTION

The present invention pertains to output driver circuits and, more particularly, output driver circuits for use in integrated circuits (IC's).

It is common in the electronic art, especially the integrated circuit (IC) art to provide a buffer or driver at the circuit output. The words "buffer" or "driver" are used interchangeably in the art and herein.

The output buffer must supply sufficient current to charge the interface connections to the circuit (e.g., the package leads) plus whatever signal leads are used to couple the circuit to the input of the next electronic function. The package leads and the interconnecting signal leads inherently posses inductance. Further, the ground and power leads which supply the circuit often have significant inductance and other AC impedance. As a consequence, when the output driver rapidly changes state, e.g., from a logical "1" to a logical "0", oscillations can occur in the output. This is undesirable, especially when these oscillations cause a "bounce-back" that exceed the magnitude of the logical "0" transition level.

In the prior art, this problem has been dealt with by, for example, waiting until the oscillations have died out before using the ouput, by reducing the rise time of the output signal to reduce the severity of the oscillations (e.g., by employing gradual switching), by adding a fixed resistance to the output circuit to hasten the damping of the oscillations or by a combination of the above. However, this can adversely affect the overall circuit performance and is not always desirable. Hence, a need continues to exist for an improved output buffer that provides oscillation damping without significant loss of circuit speed.

DESCRIPTION OF THE PREFERRED EMBODIMENT

Figure 1:
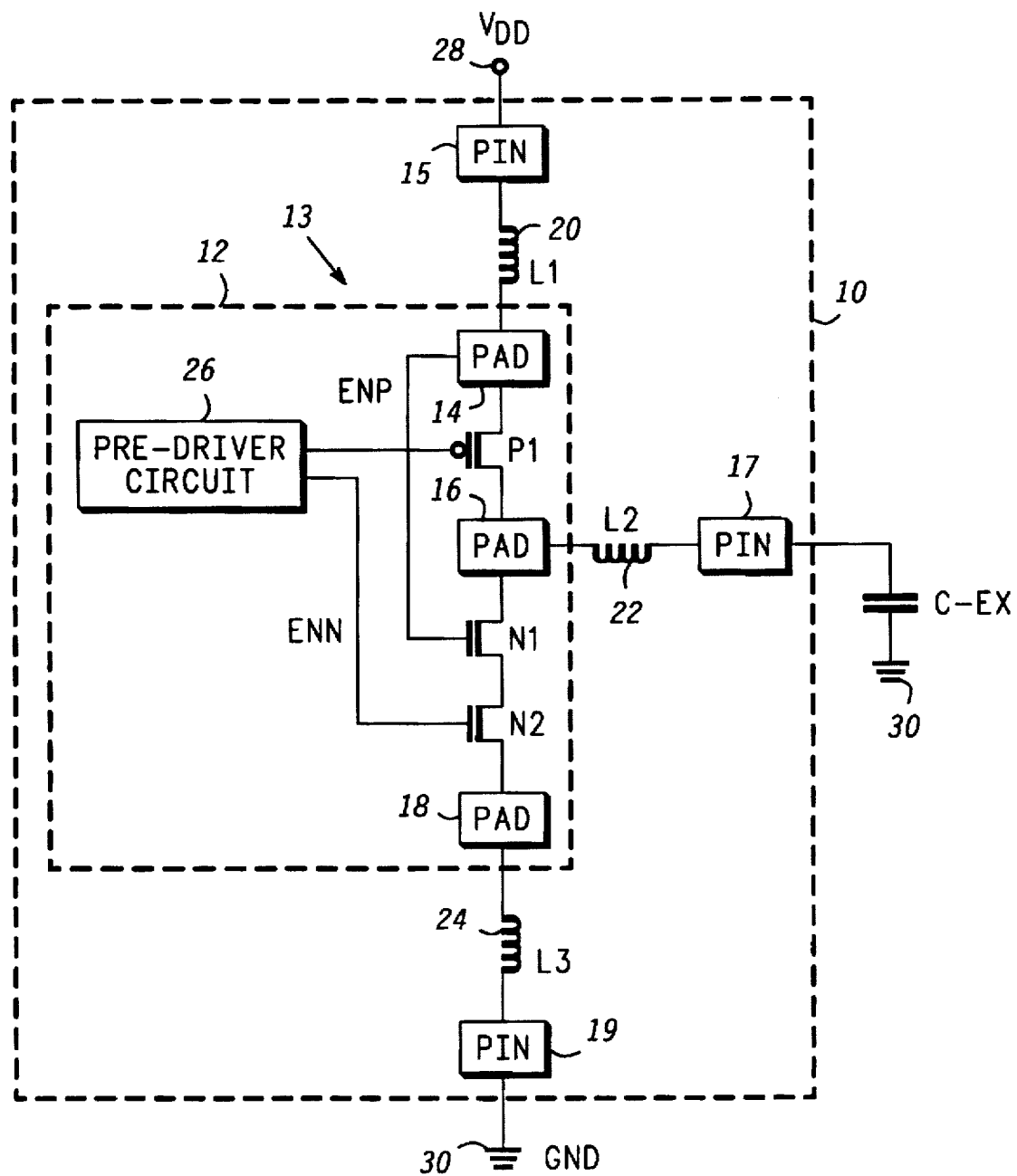
FIG. 1 is a simplified schematic diagram of a typical prior art output buffer circuit.
Figure 2:
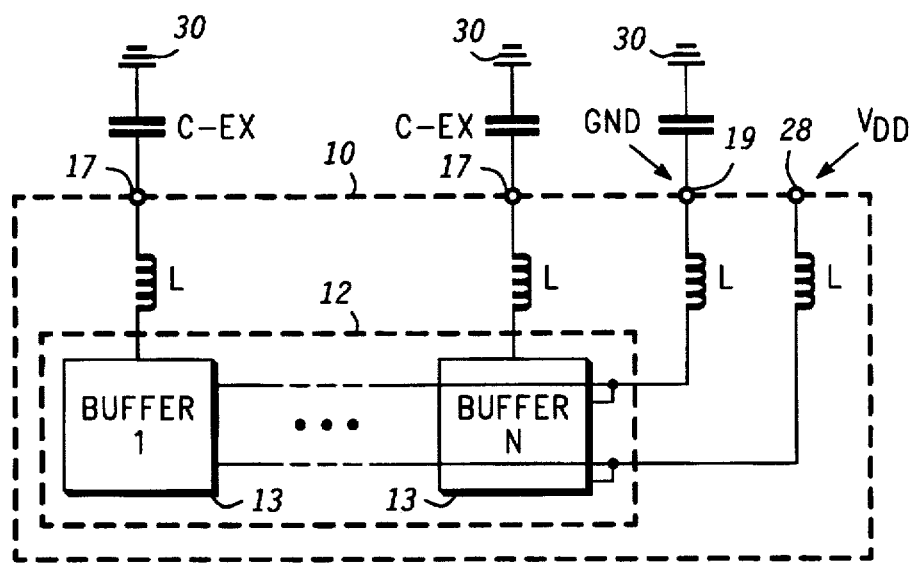
FIG. 2 illustrates an array of N buffers on the same Integrated Circuit (IC) chip, using common supply pins, and driving capacitive external loads.
Figure 3:
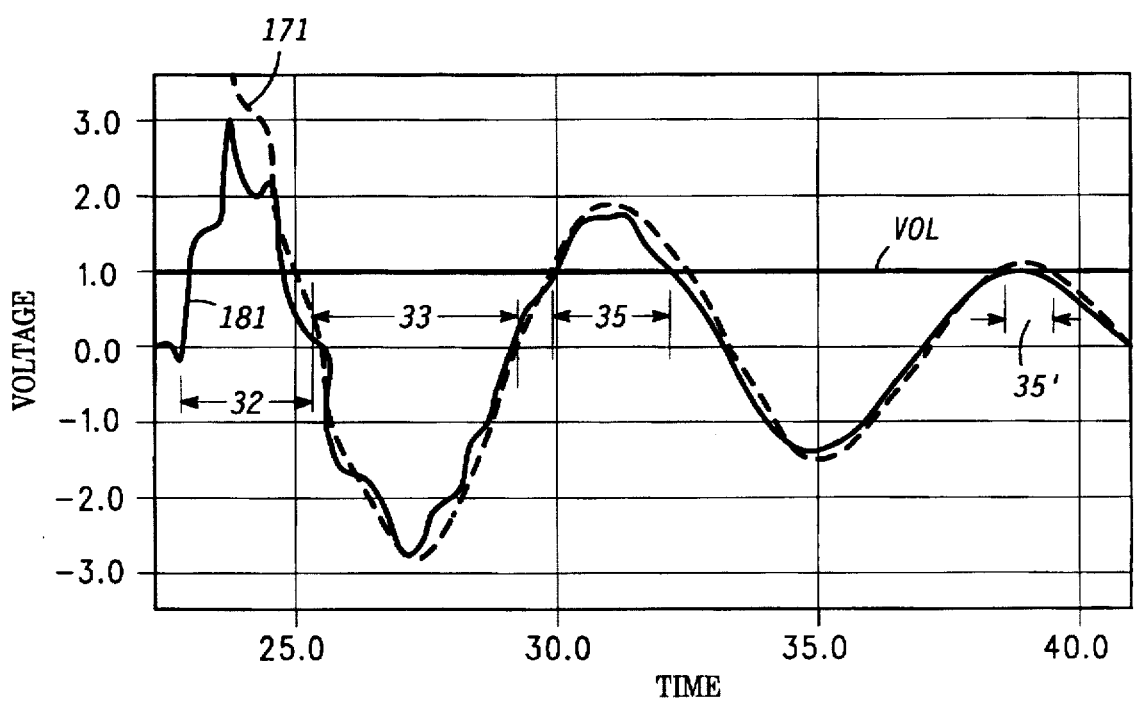
FIG. 3 is a plot of voltage versus time for the circuit of FIG. 1 obtained by computer simulation for N buffers connected as shown in FIG. 2, when they change state at substantially the same time from a logical "1" to a logical "0"

FIG. 1 is a simplified schematic circuit diagram of typical prior art integrated circuit (IC) 10 having therein IC microchip 12 with output buffer 13 driving capacitive external load C-ex. FIG. 2 illustrates an array of N such buffers 13, located on the same IC microchip and driving N capacitive external loads C-ex. FIG. 3 is a SPICE computer simulation of the output voltage at pin 17 and ground voltage at pad 18 versus time for the circuit of FIG. 2 when all N buffers change together from a logical "1" to a logical "0".

Figure 4:
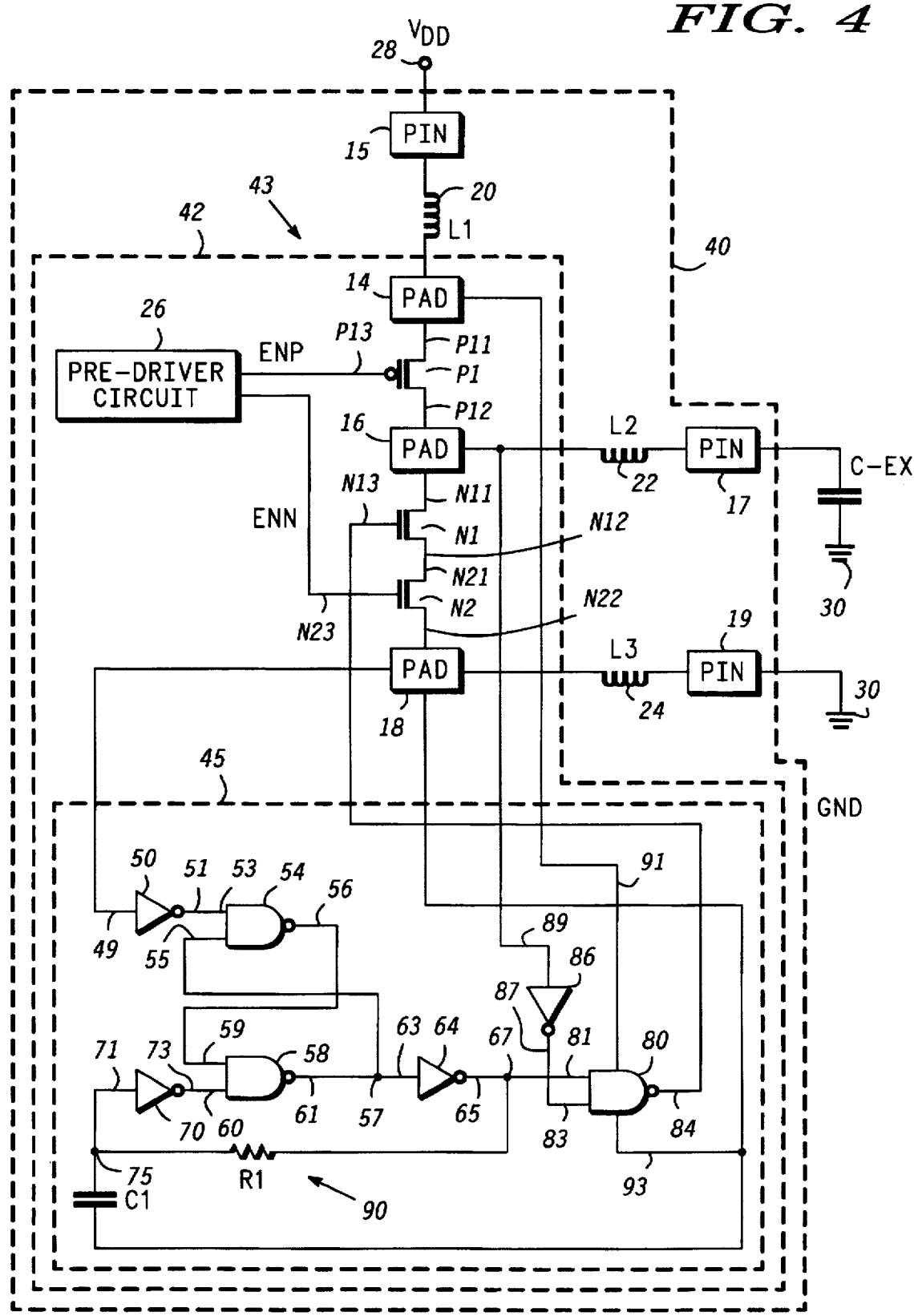
FIG. 4 is a simplified schematic diagram of an improved output buffer circuit according to a preferred embodiment of the present invention.

The logical function performed by microchip 12 is not relevant. What is of concern is how the output of microchip 12 is coupled to an external circuit through output buffer 13. For convenience of explanation and not intended to be limiting, output buffer 13 is illustrated as employing CMOS transistors P1, N1, N2, but other kinds of transistors or switches can also be employed. In FIGS. 1-2, 4, for convenience of explanation, a logical "1" corresponds approximately to the supply voltage (VDD) level and a logical "0" corresponds approximately to the reference potential or ground (GND) level, with a conventional guard band, e.g., where Vol is the upper limit of the voltage corresponding to a logical "0". Persons of skill in the art will understand based on the explanation herein that other logic and voltage levels can also be used.

Microchip 12 has bonding pads 14, 16, 18 which serve as connection points to the microchip. Bonding pad 14 is coupled to connection pin 15 and power supply VDD and bonding pad 18 is coupled to pin 19 external reference potential or ground (GND) 30. All N buffers of IC 10 (see FIG. 2) derive VDD and GND from pads 14, 18, respectively. Bonding pad 16 is the output of individual buffer 13. IC 10 has external pins 15, 17, 19 coupled to pads 14, 16, 18 by leads 20, 22, 24 respectively. Leads 20, 22, 24 are part of the IC package (and wire bonds) and have inductance L1, L2, L3 respectively. For conventional low cost integrated circuit packages, L1, L2, L3 (shown generally as "L" in FIG. 2) have inductance values of the order of 15 nano-Henries, more or less. Such inductance is inherently a part of the package structure and cannot be avoided. As indicated in FIG. 2, microchip 12 contains N buffers 13. The size of N depends upon the needs of the user.

Microchip 12 includes conventional pre-driver circuit 26 whose function is to provide push-pull output signals EnP and EnN respectively to output buffer transistors P1 and N2. Circuit 10 is coupled to power supply VDD at connection 28 and to ground GND 30. Transistor N1 serves to prevent gate-to-drain stress on transistor N2 when the gate of N2 is at "0" and pin 17 and pad 16 are externally driven to a voltage higher than VDD, e.g., to 5 volts by other portions of the overall circuit when the circuit is intended to operate at VDD of less than 5 volts.

FIG. 3 shows a SPICE simulation of the circuit of FIGS. 1-2, presenting output voltage (trace 171) on pin 17 and internal voltage (trace 181) of on-chip ground pad 18, in response to a positive going N-channel enable signal EnN. When the output buffers illustrated in FIGS. 1-2 change state substantially simultaneously, e.g., switch from a logical "1" (e.g., VDD) to a logical "0" (e.g., GND), as shown by trace 171 in FIG. 3, then external ground 30 must supply a current pulse to discharge the load devices. Due to inductance L, on-chip ground pad 18 initially follows N-channel enable signal EnN, thereby providing a first output oscillation shown in region 32 in FIG. 3 wherein trace 181 swings positive and region 33 wherein trace 181 swings negative. The period of this oscillation is about $2 \times \alpha \times (L \times N \times C)^{1/2}$ where L is the package lead inductance and C is the external capacitive load C-ex.

When the EnN transition is sufficiently rapid, as is often the case with high speed switching circuits, the oscillation in regions 32–33 and following region 34 can be sufficiently large that in region 34, output voltage 171 swings back above the Vol level corresponding to the upper voltage limit for a logical "0" output (see region 35, 35' in FIG. 3). This swing is referred to as "bounce-back". If the bounce-back is sufficiently large, it can be interpreted by subsequent circuits as another switching event, e.g., V-out making a "0" to "1" transition. When this happens, additional time must be allowed for the oscillation to decay until V-out (trace 171) stays below the Vol level when circuit 10 should be presenting a logical "0" out-put. Assuming that Vol is about 1.0 volts, this does not occur until over 39 nanoseconds (to pass both peaks) after the start of the transition in the simulation of FIG. 3.

The problem shown in FIG. 3 can be reduced by slowing down the EnN and EnP signal transitions or by adding resistance in the external signal leads or both, but this degrades the overall performance of circuit 10. The circuit becomes slower. Hence a means for clamping the output buffer oscillations below the Vol level without a loss of circuit speed is much desired. This is provided by the present invention.

Figure 5:
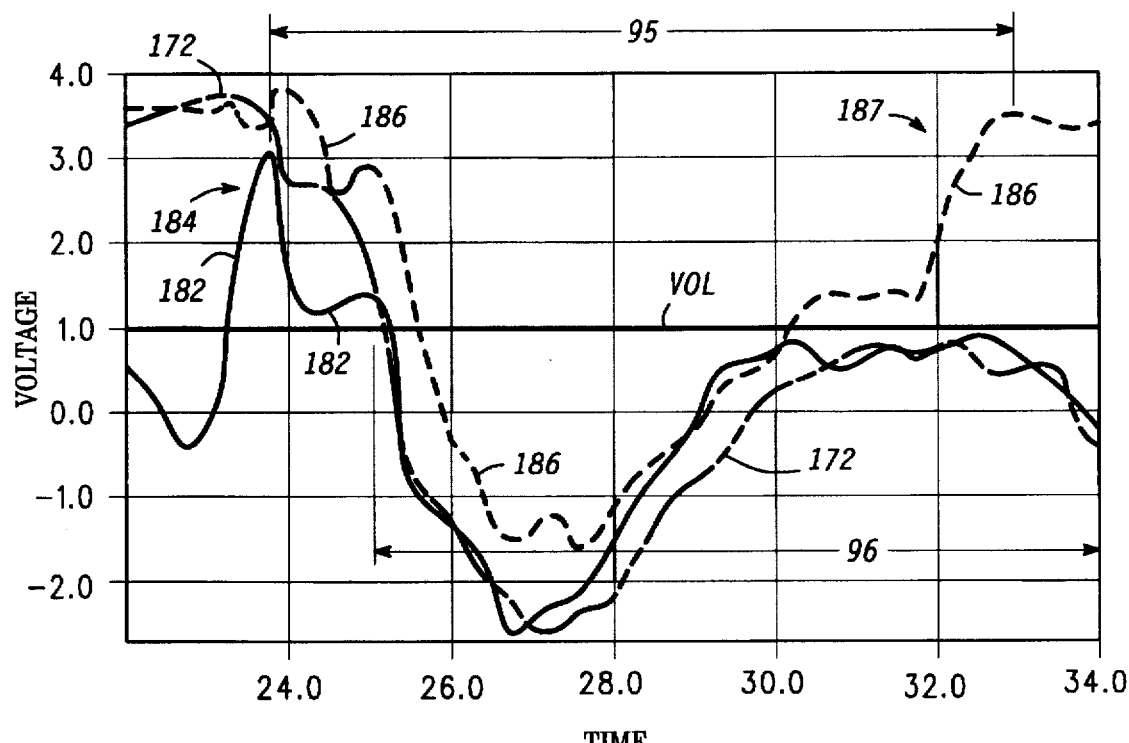
FIG. 5 is a plot of voltage versus time similar to that in FIG. 3, but for the buffer circuit of FIG. 4.
Figure 6:
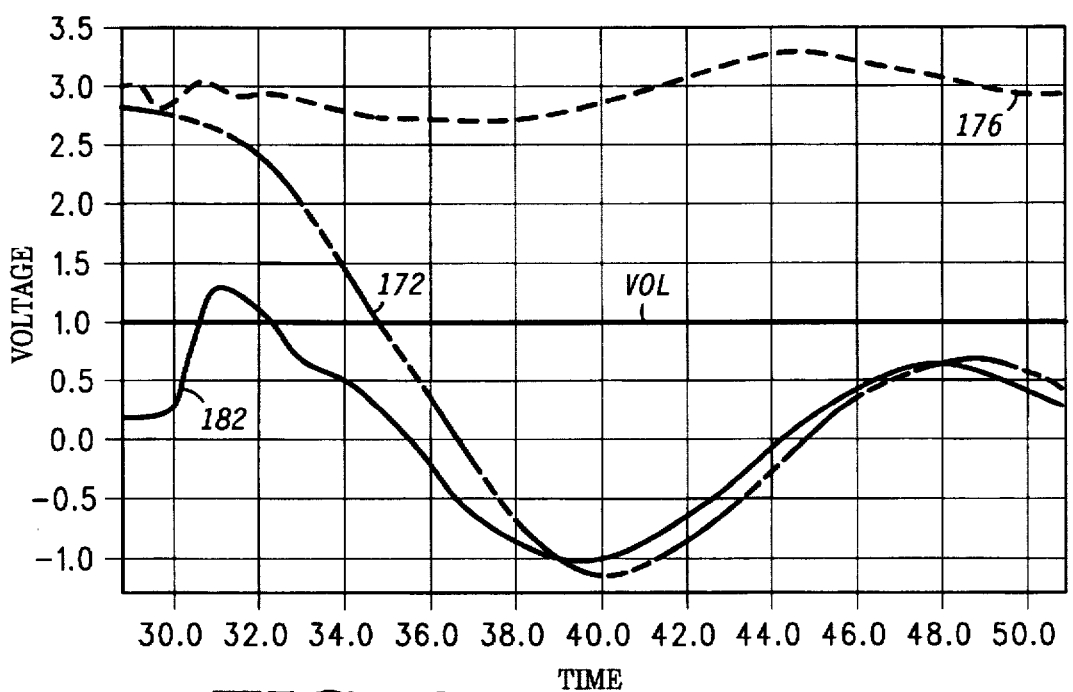
FIG. 6 is a further plot of voltage versus time for the circuit of FIG. 4.

FIG. 4 is a simplified schematic diagram of improved integrated circuit (IC) 40 having therein IC microchip 42 with output buffer 43 driving capacitive external load C-ex. An array of N such buffers 43 driving N capacitive external loads C-ex has the same appearance as FIG. 2 but with IC output buffer 13 replaced by IC output buffer 43 and microship 12 replaced by microchip 42. FIGS. 5 and 6 show SPICE simulations of the operation of buffer 43 when all N buffers change together from a logical "1" to a logical "0". FIG. 5 corresponds to circuits made under "fast process conditions" (e.g., having high transconductance devices) and FIG. 6 to circuits made under "slow process conditions" (e.g., having low transconductance devices). "Fast" and "slow" are merely short-hand ways of referring to the effect of process variations on the gain of the transistors or other switches within the IC microchip. The same reference numbers or labels are used in FIG. 4 for elements having analogous functions as corresponding elements in FIGS. 1–2.

The damping circuit illustrated in FIG. 4 is designed to damp high-to-low transitions, such as are illustrated in FIGS. 3, 5–6, since the problem of ground (GND) line oscillation is generally more serious in terms of producing false logic level shifts than are power (VDD) line oscillations during opposite direction transitions. However, this is merely for convenience of explanation and those of skill in the art will understand based on the description herein how to selectively damp other transitions.

In FIG. 4, switch P1 has first current carrying terminal P11 coupled to pad 14, second curent carrying terminal P12 coupled to output pad 16 and input P12 coupled to pre-driver circuit 26 to receive the EnP signal. Switch N2 has first current carrying terminal N21 coupled to second current carrying terminal N12 of switch N1. Switch N2 has second current caying terminal N22 coupled to reference voltage pad 18. Input N23 of switch N2 is coupled to pre-driver circuit 25 to receive the EnN signal. Third switch N1 has first current carrying terminal N11 coupled to buffer output pad 16 and current carrying terminal N12 coupled to first current carrying terminal N21 of second switch N2. Input N13 of switch N1 is coupled to circuit 45 for controlling the impedance of variable resistance switch N1 during logical transitions of buffer 43.

Input N13 of switch N1 is no longer connected directly to VDD pad 14 as it was in FIG. 1, but is coupled to VDD pad 14 and GND pad 18 through control circuit 45. Damping is obtained by controlling the voltage appearing at gate N13 of transistor N1 so that the resistance R(t) of transistor N1 increases temporarily. During ordinary operation, input N13 is at VDD (logic high), but when damping is needed, e.g., during a high-low transition of outputs 16, 17 (see trace 172 on FIG. 5), control circuit 45 (see FIG. 4) partially shuts off N1 to add resistance to buffer 43. This added resistance R(t) is transitory and is only created when there are rapid transitions. When output transitions are more gradual so that bounce-back is not a problem the resistance of N1 is substantially unchanged. Causing N1 to change its resistance, damps the undesirable portion of the output oscillations without appreciably slowing the overall buffer performance. Reference should also be had to FIGS. 5–6 wherein trace 172 is the buffer output voltage, trace 182 is the internal chip ground (GND) voltage appearing on pad 18, and trace 186 is the feedback voltage on gate N13 of transistor N1 provided by control circuit 45. The operation of circuit 40 is now described in more detail.

When output pad 16 and pin 17 change from "1" to "0" (e.g., in response to a positive going EnN signal), positive-going pulse 184 appears on GND pad 18 (see trace 182 in FIG. 5) and is detected by first inverter 50 whose input 49 is coupled to pad 18. Output 51 of first inverter 50 is coupled to first input 53 of first NAND gate 54. Output 56 of first NAND gate 54 is set therefore to a "1". Output 56 of first NAND gate 54 is coupled to first input 59 of second NAND gate 58. Since second input 60 of second NAND gate 58 is also a "1" and node 57 changes to a "0". Node 57 is coupled back to second input 55 of first NAND gate 54 and to input 63 of second inverter 64. Output 65 of second inverter 64 is coupled to node 67. Node 67 changes to a "1". Node 67 is coupled to first input 81 of third NAND gate 80 and through feedback resistor R1 to node 75. Node 75 is coupled to ground pad 18 via capacitor C1. Node 75 is also coupled to input 71 of third inverter 70 whose output 73 is coupled to second input 60 of second NAND gate 58.

Buffer output pad 16 is coupled to input 89 of fourth inverter 86. Output 87 of fourth inverter 86 is coupled to second input 83 of third NAND gate 80. When pad 16 changes from high-to-low, output 87 of fourth inverter 86 becomes a "1" and output 84 of third NAND gate 80 changes to "0". Output 84 is coupled to input N13 of transistor N1. This causes switch N1 to partially turn off (see trace 186 in FIG. 5), thereby adding resistance to buffer 43. After an RC delay determined by the time constant R1, C1 of feedback circuit 90 around cross-coupled first and second NAND gates 54, 58 (e.g., at about time 187 in FIG. 5), node 67 returns to "0" and node 84 and input N13 of transistor N1 returns to "1", e.g., VDD. Adding resistance by partially shutting off transistor N1 during time regions 95 turns the LCex buffer circuit of FIG. 1 into an R(t)LCex circuit of FIG. 4, whereby the loss introduced by the resistance R(t) of partially turn-ed off transistor switch N1 damps the oscillation of the output signal The result is that in period 96 of FIG. 5, V-out (trace 172) does not rise above the upper voltage limit Vol of the logical "0" signal, as it did with prior art buffer circuit 13.

Trace 186 in FIGS. 5–6 illustrates the voltage on input N13 of switch N1. It can be seen in FIG. 5 that the voltage on input N13 is pulled low during the critical first oscillation portion of the output voltage swing, thereby introducing the damping effect and preventing V-out from bouncing back above Vol during subsequent oscillations.

FIG. 6 is a plot similar to FIG. 5, but for conditions where the V-out transition is slow enough that the V-out bounce is not significant and no damping is needed. It can be seen that trace 186 showing the voltage on input N13 of switch N1 does not change appreciably indicating that no damping effect occurred, i.e., no significant resistance was added. The automatic inclusion or omission of oscillation damping in accordance with the speed of the output transition is a feature of the present invention and makes the circuit especially valuable for this purpose. A further feature is flint damping is provided with no significant degradation in circuit speed, as may be understood by comparing FIGS. 3 and 5 where the elapsed time (31–32 nanoseconds) to the bounce-back peak in V-out is about the same, but the magnitude of the bounce-back peak is much smaller in FIG. 5.

The present invention is particularly useful in connection with output drivers on IC devices that operate at supply voltages smaller than what is in use in other parts of the overall circuit. For example, the present invention when designed to operate below 5 volts is still able to tolerate 5 volts at the buffer driver output which may occur due to external drive from other portions of the overall circuit. Thus, the present invention is what is referred to in the art as a "5 volt tolerant buffer". Persons of skill in the art will understand that "5 volts" is merely a convenient example because of its widespread use in modern transistor electronics and that the present invention applies to other voltage ranges where the buffers are intended to operate at a supply voltage less than a voltage which may be externally applied to the buffer output from other portions of the overall circuit.

Based on the foregoing explanation, those of skill in the art will understand that the present invention provides oscillation damping in an output buffer without adversely affecting buffer speed. Thus, the present invention provides a fast output buffer with oscillation damping, which is of great practical significance. Further, this oscillation damping effect is greatest when most needed, that is, when very rapid output transitions are occurring. Further, the damping effect is smaller or zero when not needed, as for example, when comparatively slow output transitions are occurring. It is still further apparent that this valuable result is obtained with relatively few additional components and of a kind that can be easily included within the integrated circuit chip itself.

Although the preferred embodiment of the invention has been illustrated, and fit embodiment described in detail, this is merely for convenience of explanation and not intended to be limiting. It will be readily apparent to those skilled in the art that various modifications may be made in the present invention without departing therefrom or from the scope of the appended claims. For example, bipolar devices or other types of transistors or switches can be used instead of MOS devices. In addition, other types of transitions besides those specifically illustrated can also be damped in a similar manner. Based on the description herein, persons of skill in the art will understand how to implement the present invention with such modifications.

We claim:

1. An electronic device having at least one variable damping output buffer on a chip, the output buffer having an output connection, a power connection and a ground connection, wherein the output buffer has a variable resistance in its output path, the variable resistance being responsive to changes in voltages appearing on the output connection and on the ground connection such that the variable resistance increases when a voltage appearing on the output connection does undergo a rapid change and decreases when the voltage does undergo a slow change, and wherein the variable resistance is responsive to a control circuit having inputs coupled to the ground connection and to the output connection, and wherein the control circuit further comprises digital logic elements which include a first pair of gates having cross-coupled inputs and a third gate having a first input derived from an output of the first pair of gates and a second input coupled to the output connection.

2. The electronic device of claim 1 further comprising first and second pairs of inverters, the first pair of inverters feeding, respectively, first inputs of the first pair of gates wherein second inputs of the first pair of gates are coupled to outputs of another of the first pair of gates, and the second pair of inverters feeding, respectively, first and second inputs of the third gate.

3. The electronic device of claim 2 further comprising a resistor and capacitor for adjusting a rate of change of resistance of the variable resistance.

4. A circuit including an output buffer comprising:
a first switch, a second switch and a third switch, wherein the first switch has an input and a first output and a second output, and the second switch has an input and a first output and a second output, and the third switch has an input and a first output and a second output;
wherein the input of the first switch is coupled to a first input signal source and the input of the second switch is coupled to a second input signal source and the input of the third switch is coupled to a reference potential source and a power supply source of the circuit through a control circuit responsive to changes in a voltage of the reference potential source;
wherein, for the first switch, the first output is coupled to the power supply source and the second output is coupled to an output of the circuit;
wherein, for the second switch, the second output is coupled to the reference potential source; and
wherein for the third switch, the first output is coupled to the output of the circuit, and the second output is coupled to the first output of the second switch.

5. The circuit of claim 4 wherein the reference potential source is an on-chip connection which is coupled to an external reference potential via a lead having inductance.

6. The circuit of claim 5 wherein the voltage is proportional to a rate of change of current flowing through the lead.

7. The circuit of claim 4 wherein the first switch is a first transistor of a first conductivity type and the second switch is a second transistor of an opposite conductivity type and the third switch is a third transistor of the opposite conductivity type.

8. The circuit of claim 4 wherein the control circuit comprises a resistor and a capacitor coupled together to provide a time constant affecting a duration of a signal provided by the control circuit to the input of the third switch to vary a resistance of the third switch.

9. The circuit of claim 8 wherein the resistor and capacitor have a common node and the capacitor has another node coupled to the reference potential source.

10. The circuit of claim 4 further comprising a first inverter having an input coupled to the second output of the second switch and an output coupled to a first terminal of a first NAND gate whose output is coupled to a first input of a second NAND gate, wherein an output of the second NAND gate is coupled to a second input of the first NAND gate and to an input of a second inverter whose output is coupled to an input of a fourth inverter whose output is coupled to a second input of the second NAND gate, and wherein the output of the second inverter is further coupled to a first input of a third NAND gate whose output is coupled to the input of the third switch, and wherein a second input of the third NAND gate is coupled to an output of a fourth inverter whose input is coupled to an output of the output buffer.

11. An electronic device comprising a microchip having one or more output buffer deriving power from a common power connection pad and from a common reference potential connection pad, where the one or more output buffer has an output connection pad, and wherein the one or more output buffer has a first transistor coupled between the common power connection pad and the output connection pad and a second transistor coupled between the output connection pad and the common reference potential connection pad and a third transistor coupled between the second transistor and the output connection pad, wherein the third transistor itself adds a time varying resistance to the one or more output buffer when the output connection pad does undergo a rapid voltage change.

12. The electronic device of claim 11 wherein the third transistor has a control input coupled to the common reference potential connection pad, without being connected to a control input of the first transistor or a control input of the second transistor.

13. The electronic device of claim 12, wherein the electronic device has first and second inputs functionally coupling first and second input signals to the control inputs of the first and second transistors, and wherein the control input of the third transistor is coupled to the common reference potential connection pad by a control circuit comprising multiple logic gates which do not receive the first and second input signals.

14. The electronic device of claim 12 where the control input of the third transistor is coupled to inputs of the electronic device through the first and second transistors and not otherwise.

15. The electronic device of claim 12 wherein the control input of the third transistor is coupled to inputs of the electronic device through the first and second transistors via a control circuit.

16. An electronic device comprising a microchip having one or more output buffer deriving power from a common power connection pad and from a common reference potential connection pad, where the one or more output buffer has an output connection pad, and wherein the one or more output buffer has a first transistor coupled between the common power connection pad and the output connection pad and a second transistor coupled between the output connection pad and the common reference potential connection pad and a third transistor coupled between the second transistor and the output connection pad for adding a time varying resistance to the one or more output buffer when the output connection pad does undergo a rapid voltage change, wherein the third transistor has an input coupled to the common reference potential connection pad, and wherein the input of the third transistor is coupled to the common reference potential connection pad by a control circuit comprising multiple logic gates and wherein the control circuit further comprises a predetermined resistance and a predetermined capacitance, the predetermined resistance being coupled across at least one of the multiple logic gates and the predetermined capacitance being coupled between the predetermined resistance and the common reference potential connection pad.

17. An electronic device comprising a microchip having one or more output buffer deriving power from a common power connection pad and from a common reference potential connection pad, where the one or more output buffer has an output connection pad, and wherein the one or more output buffer has a first transistor coupled between the common power connection pad and the output connection pad and a second transistor coupled between the output connection pad and the common reference potential connection pad and a third transistor coupled between the second transistor and the output connection pad for adding a time varying resistance to the one or more output buffer when the output connection pad does undergo a rapid voltage change, and wherein the one or more output buffer further comprises a first inverter having an input coupled to the common reference potential connection pad and an output coupled to a first terminal of a first NAND gate having an output which is coupled to a first input of a second NAND gate, wherein an output of the second NAND gate is coupled to a second input of the first NAND gate and to an input of a second inverter having an output which is coupled to an input of a fourth inverter having an output which is coupled to a second input of the second NAND gate, and wherein the output of the second inverter is further coupled to a first input of a third NAND gate having an output which is coupled to a control input of the third transistor, and wherein a second input of the third NAND gate is coupled to an output of a fourth inverter having an input which is coupled to the output connection pad.

* * * * *